United States Patent
Kim et al.

(10) Patent No.: US 11,670,563 B2
(45) Date of Patent: Jun. 6, 2023

(54) THERMALLY ENHANCED FCBGA PACKAGE

(71) Applicant: STATS ChipPAC Pte. Ltd., Singapore (SG)

(72) Inventors: KyungOe Kim, Incheon (KR); Wagno Alves Braganca, Jr., Incheon (KR); DongSam Park, Incheon (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 0 days.

(21) Appl. No.: 17/304,659

(22) Filed: Jun. 24, 2021

(65) Prior Publication Data

US 2022/0415744 A1   Dec. 29, 2022

(51) Int. Cl.
| | |
|---|---|
| *H01L 23/367* | (2006.01) |
| *H01L 23/31* | (2006.01) |
| *H01L 23/498* | (2006.01) |
| *H01L 23/00* | (2006.01) |
| *H01L 21/48* | (2006.01) |
| *H01L 21/56* | (2006.01) |

(52) U.S. Cl.
CPC ........ *H01L 23/367* (2013.01); *H01L 21/4853* (2013.01); *H01L 21/4857* (2013.01); *H01L 21/4871* (2013.01); *H01L 21/565* (2013.01); *H01L 23/3185* (2013.01); *H01L 23/49816* (2013.01); *H01L 23/49822* (2013.01); *H01L 24/16* (2013.01); *H01L 2224/16227* (2013.01); *H01L 2924/15311* (2013.01); *H01L 2924/18161* (2013.01)

(58) Field of Classification Search
CPC ............... H01L 23/16–26; H01L 21/54; H01L 23/02–10; H01L 2924/171–17798; H01L 23/42–4338; H01L 21/4871–4882; H01L 23/367–3677; H01L 23/36–3738
See application file for complete search history.

(56) References Cited

U.S. PATENT DOCUMENTS

| | | | |
|---|---|---|---|
| 7,250,676 B2 | 7/2007 | Wang | |
| 8,013,436 B2 | 9/2011 | Hung et al. | |
| 2007/0296079 A1 | 12/2007 | Huang et al. | |
| 2009/0283895 A1* | 11/2009 | Kikuchi | H01L 24/19 257/692 |
| 2014/0346661 A1* | 11/2014 | Liu | H01L 23/42 257/713 |
| 2019/0172816 A1* | 6/2019 | Kim | H01L 23/552 |
| 2021/0028122 A1 | 1/2021 | Son et al. | |

* cited by examiner

*Primary Examiner* — Selim U Ahmed
*Assistant Examiner* — Evan G Clinton
(74) *Attorney, Agent, or Firm* — Brian M. Kaufman; Robert D. Atkins; Patent Law Group: Atkins and Associates, P. C.

(57) ABSTRACT

A semiconductor device has a heat spreader with an opening formed through the heat spreader. The heat spreader is disposed over a substrate with a semiconductor die disposed on the substrate in the opening. A thermally conductive material, e.g., adhesive or an elastomer plug, is disposed in the opening between the heat spreader and semiconductor die. A conductive layer is formed over the substrate, heat spreader, and thermally conductive material.

17 Claims, 11 Drawing Sheets

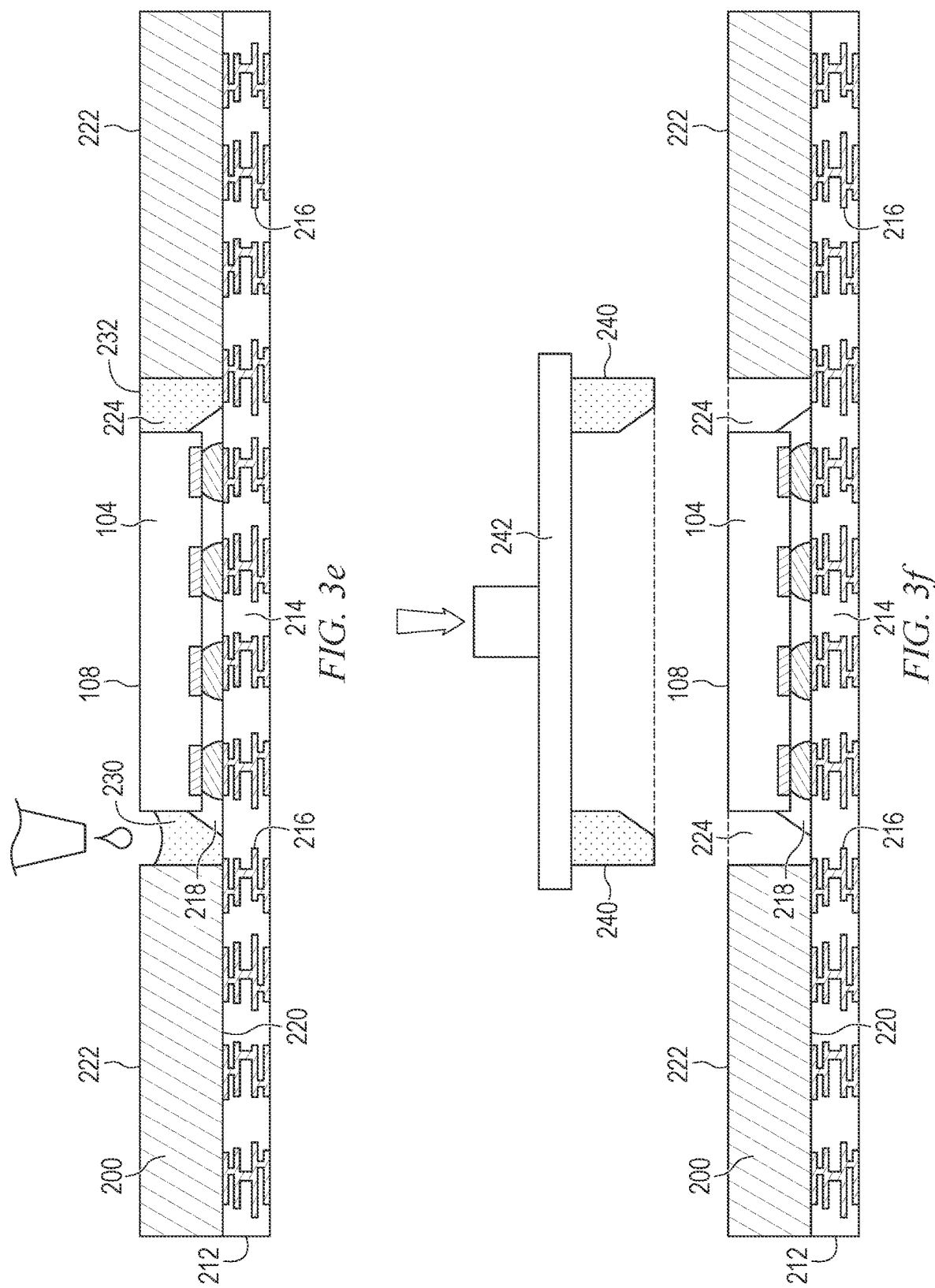

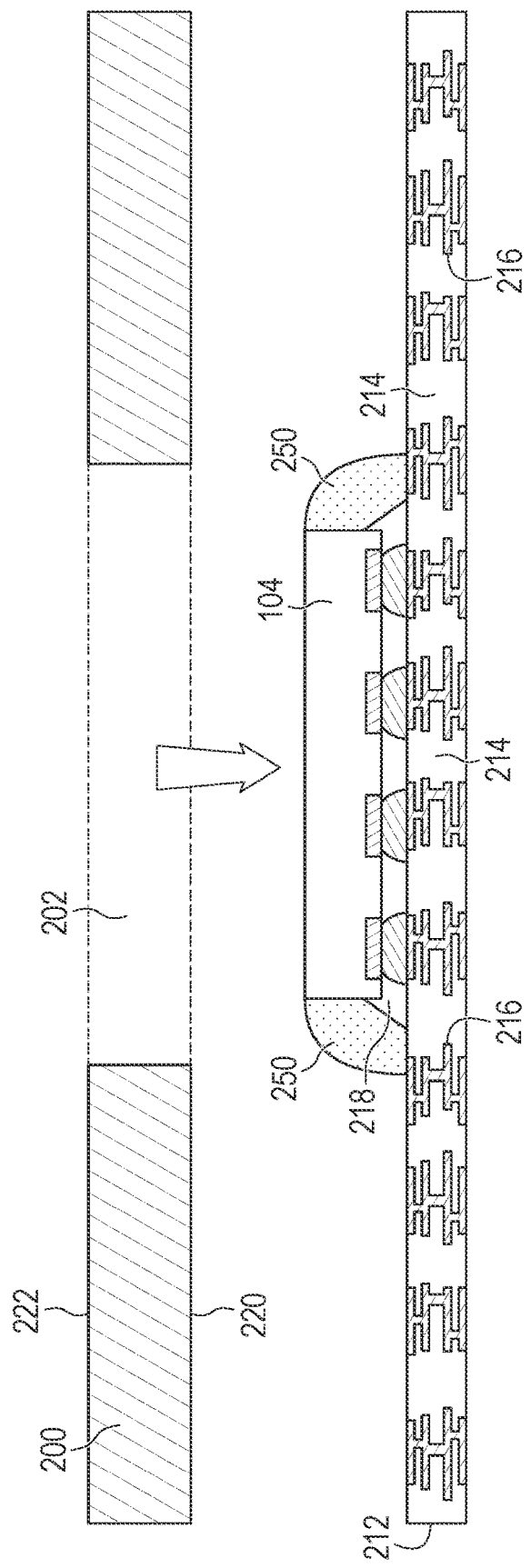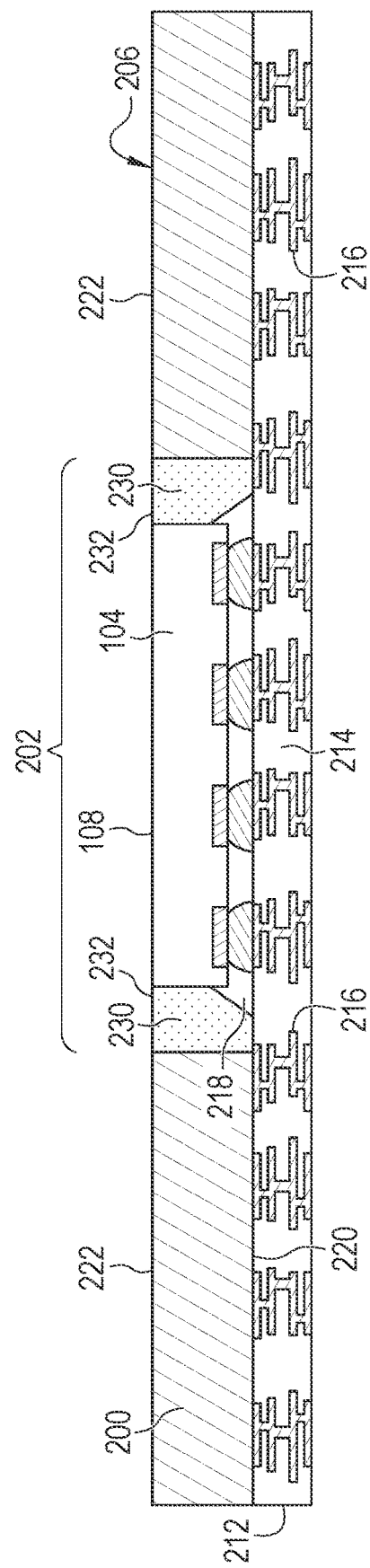

THERMALLY ENHANCED FCBGA PACKAGE

FIELD OF THE INVENTION

The present invention relates in general to semiconductor manufacturing and, more particularly, to a semiconductor device and method for forming flip chip ball-grid array packages with enhanced thermal characteristics.

BACKGROUND OF THE INVENTION

Semiconductor devices are commonly found in modern electronic products. Semiconductor devices perform a wide range of functions such as signal processing, high-speed calculations, transmitting and receiving electromagnetic signals, controlling electronic devices, transforming sunlight to electricity, and creating visual images for television displays. Semiconductor devices are found in the fields of communications, power conversion, networks, computers, entertainment, and consumer products. Semiconductor devices are also found in military applications, aviation, automotive, industrial controllers, and office equipment.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with conductive layers, bumps, stud bumps, conductive paste, bond wires, or other suitable interconnect structures. An encapsulant or other molding compound is deposited over the package to provide physical support and electrical isolation. The finished package is then inserted into an electrical system and the functionality of the semiconductor device is made available to the other system components.

FIG. 1a shows a semiconductor wafer 100 with a base substrate material 102, such as silicon, germanium, aluminum phosphide, aluminum arsenide, gallium arsenide, gallium nitride, indium phosphide, silicon carbide, or other bulk semiconductor material. A plurality of semiconductor die or components 104 is formed on wafer 100 separated by a non-active, inter-die wafer area or saw street 106 as described above. Saw street 106 provides cutting areas to singulate semiconductor wafer 100 into individual semiconductor die 104. In one embodiment, semiconductor wafer 100 has a width or diameter of 100-450 millimeters (mm).

FIG. 1B shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed within or over the die and electrically interconnected according to the electrical design and function of the die. For example, the circuit may include one or more transistors, diodes, and other circuit elements formed within active surface 110 to implement analog circuits or digital circuits, such as digital signal processor (DSP), ASIC, MEMS, memory, or other signal processing circuit. Semiconductor die 104 may also contain integrated passive devices (IPDs), such as inductors, capacitors, and resistors, for RF signal processing. Back surface 108 of semiconductor wafer 100 may undergo an optional backgrinding operation with a mechanical grinding or etching process to remove a portion of base material 102 and reduce the thickness of semiconductor wafer 100 and semiconductor die 104.

An electrically conductive layer 112 is formed over active surface 110 using PVD, CVD, electrolytic plating, electroless plating, or other suitable metal deposition process. Conductive layers 112 include one or more layers of aluminum (Al), copper (Cu), tin (Sn), nickel (Ni), gold (Au), silver (Ag), or other suitable electrically conductive material. Conductive layer 112 operates as contact pads electrically connected to the circuits on active surface 110.

An electrically conductive bump material is deposited over conductive layer 112 using an evaporation, electrolytic plating, electroless plating, ball drop, or screen printing process. The bump material can be Al, Sn, Ni, Au, Ag, lead (Pb), bismuth (Bi), Cu, solder, and combinations thereof, with an optional flux solution. For example, the bump material can be eutectic Sn/Pb, high-lead solder, or lead-free solder. The bump material is bonded to conductive layer 112 using a suitable attachment or bonding process. In one embodiment, the bump material is reflowed by heating the material above its melting point to form conductive balls or bumps 114. Conductive bumps 114 are optionally formed over an under-bump metallization (UBM) having a wetting layer, barrier layer, and adhesion layer. Conductive bumps 114 can also be compression bonded or thermocompression bonded to conductive layer 112. Conductive bumps 114 represent one type of interconnect structure that can be formed over conductive layer 112 for electrical connection to a substrate. The interconnect structure can also use bond wires, conductive paste, stud bumps, micro bumps, or other electrical interconnects.

In FIG. 1c, semiconductor wafer 100 is singulated through saw street 106 using a saw blade or laser cutting tool 118 into individual semiconductor die 104. The individual semiconductor die 104 can be inspected and electrically tested for identification of known-good die (KGD) post-singulation.

As more and more components are integrated onto a single semiconductor die 104, thermal budgets of the die must be increased. To handle the extra thermal energy being generated, heat spreaders are added to semiconductor die during packaging. FIG. 2 shows a semiconductor package 130 with a heat spreader 132. To package semiconductor die 104, the semiconductor die is picked and placed onto a substrate 134. Bumps 114 are reflowed onto substrate 134 for mechanical and electrical coupling.

Heat spreader 132 is disposed over semiconductor die 104 as a lid. Heat spreader 132 is steel, copper, or another thermally conductive material. Adhesive is used to mechanically attach heat spreader 132 to substrate 134. A thermal interface material (TIM) 136 is disposed between heat spreader 132 and back surface 108 of die 104.

TIM 136 creates a reasonably good thermal connection between back surface 108 and the surface of heat spreader 132. However, the thermal transfer from die 104 to heat spreader 132 is limited by the thermal resistance from the die to TIM 136 and then from the TIM to the heat spreader. The use of TIM 136 also increases manufacturing process complexity and material costs. Moreover, heat spreader 132 undesirably increases the height of package 130 by requiring a thick metal layer over die 104.

Therefore, a need exists for semiconductor devices and methods of making semiconductor devices with improved thermal characteristics.

BRIEF DESCRIPTION OF THE DRAWINGS

FIGS. 3a-3j illustrate forming a semiconductor package with an open heat spreader design;

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The term "semiconductor die" as used herein refers to both the singular and plural form of the words, and accordingly, can refer to both a single semiconductor device and multiple semiconductor devices. The terms "die" and "semiconductor die" are used interchangeably.

Figure 1A:
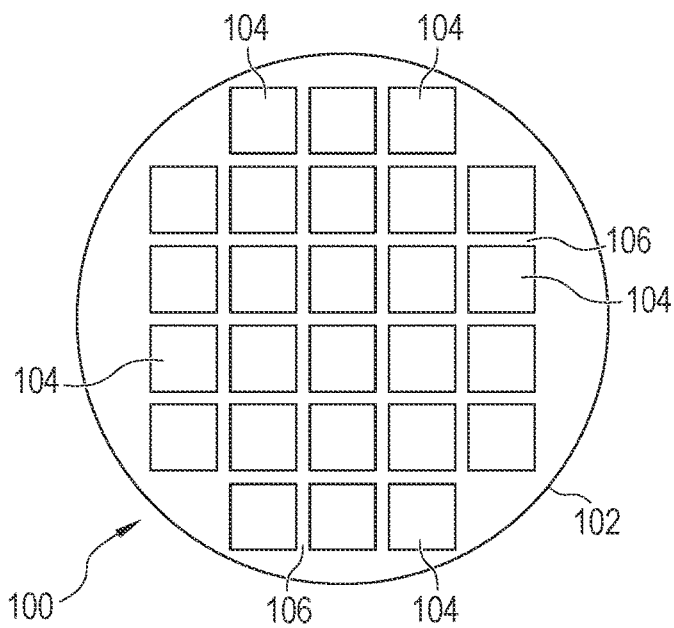
FIGS. 1a-1c illustrate a semiconductor wafer with a plurality of semiconductor die separated by a saw street.
Figure 1B:
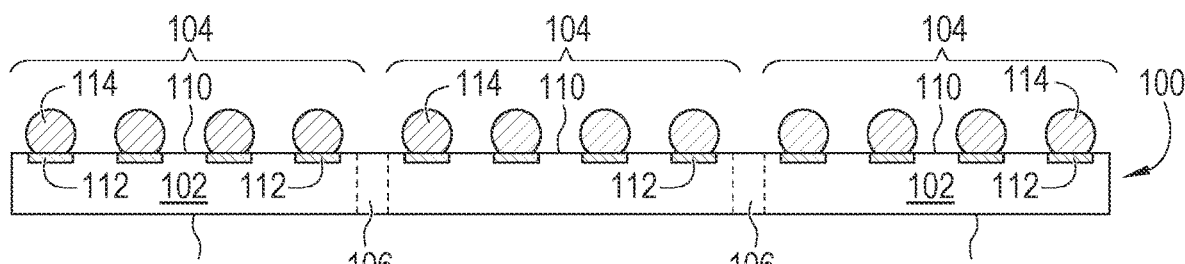
Figure 1C:
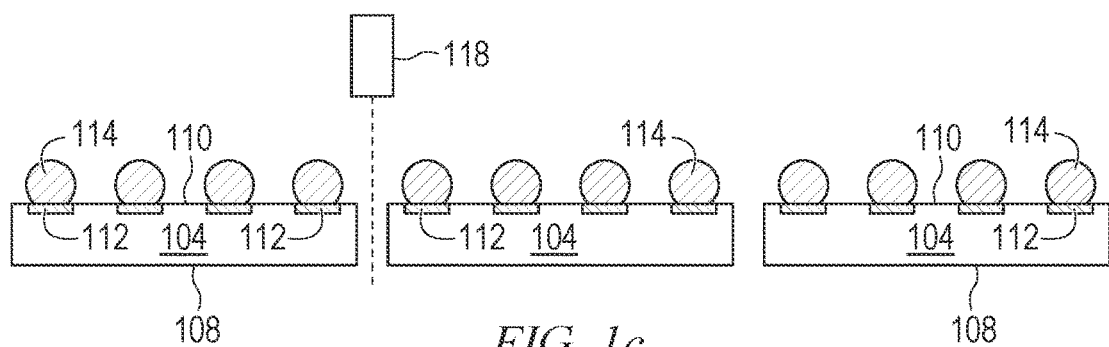
Figure 2:
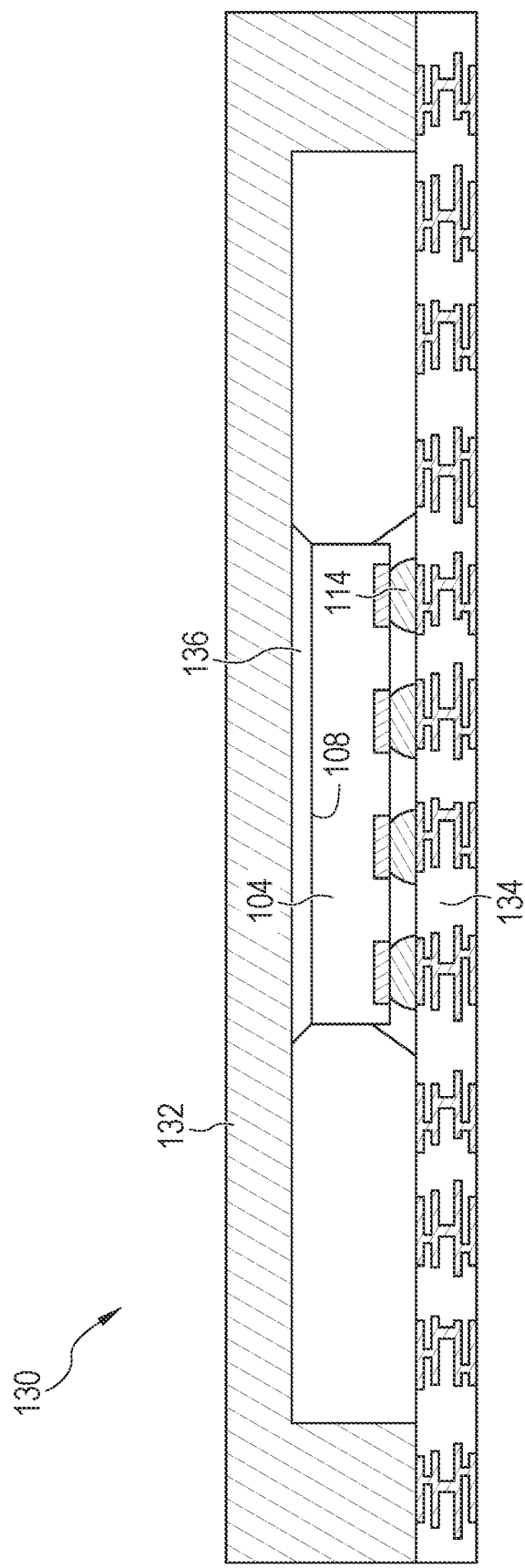
FIG. 2 illustrates a semiconductor package with a heat spreader lid.
Figure 3A:
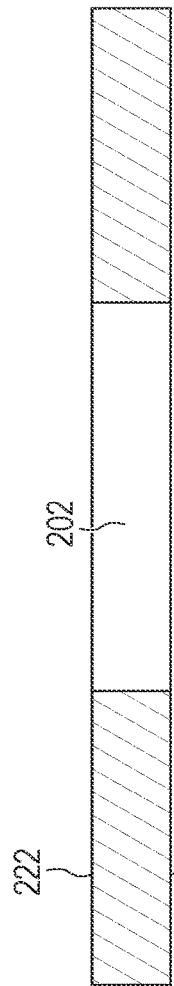
Figure 3B:
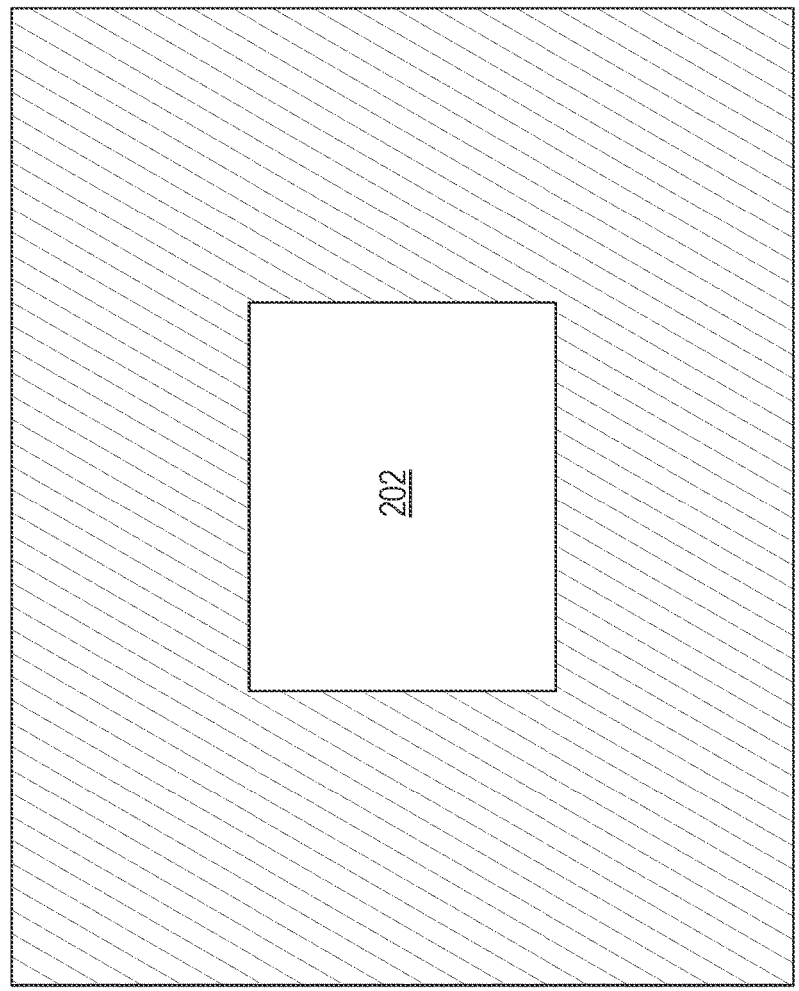

FIGS. 3a-3j illustrate forming a semiconductor package with an open heat spreader 200. FIG. 3a shows a cross-sectional view of heat spreader 200, while FIG. 3b is a plan view. Heat spreader 200 is a solid sheet of thermally conductive material with an opening 202 formed completely through the heat spreader between bottom surface 220 and top surface 222. The material of heat spreader 200 is copper, steel, carbon-fiber, or any other suitable material. Heat spreader 200 can be made from a large sheet of the material by laser, water, or saw cutting to form openings 202 and to separate individual heat spreaders from the sheet. In other embodiments, heat spreader 200 is processed as part of a large sheet with multiple openings 202 suitable for forming multiple packages at once before the heat spreader is singulated as part of the finished packages.

Figure 3C:
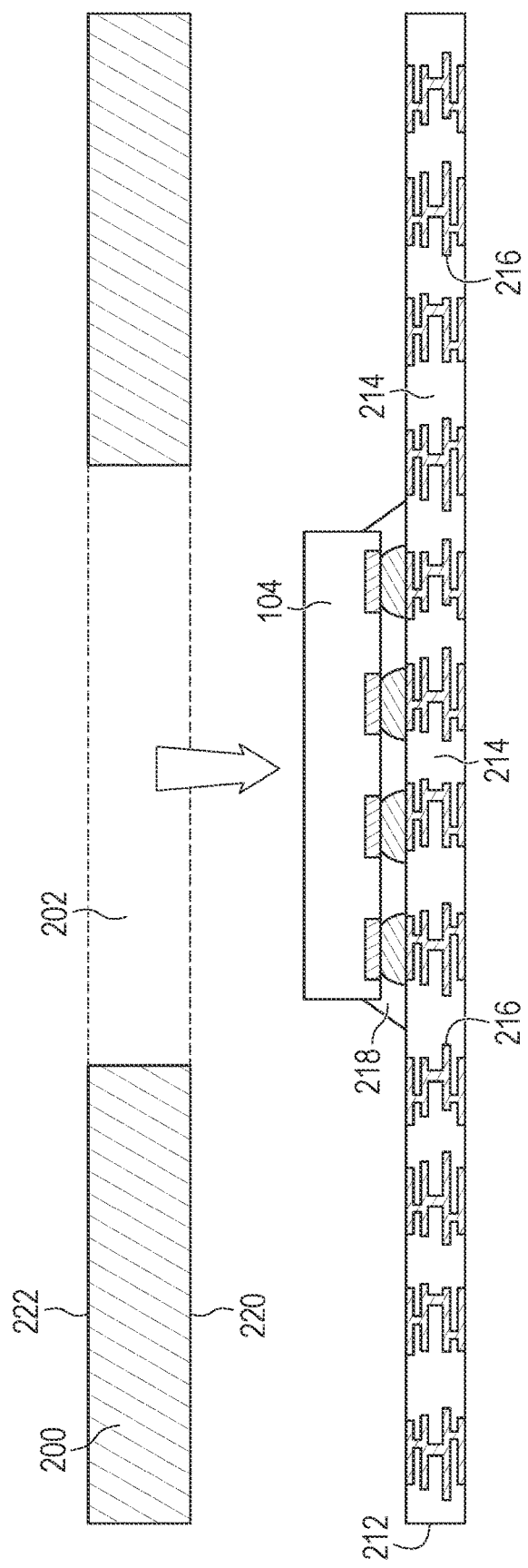

FIG. 3c shows a cross-sectional view of heat spreader 200 being disposed onto a substrate 212 around semiconductor die 104. Substrate 212 is provided as a panel large enough to form the desired number of packages together. Each individual package could extend a significant distance outside the footprint of heat spreader 200, but only the portion with the heat spreader is illustrated. Heat spreader 200 is provided to absorb thermal energy from semiconductor die 104, but other components that do not require a heatsink can be disposed on substrate 212 around the heat spreader.

Substrate 212 includes one or more insulating layers 214 interleaved with one or more conductive layers 216. Insulating layer 214 is a core insulating board in one embodiment, with conductive layers 216 patterned over the top and bottom surfaces, e.g., a copper-clad laminate substrate. Conductive layers 216 also include conductive vias electrically coupled through insulating layers 214 for vertical interconnect.

Substrate 212 can include any number of conductive layers 216 and insulating layers 214 interleaved over each other. A solder mask or passivation layer can be formed over either side or both sides of substrate 212. Openings are formed in the passivation layer to expose contact pads of conductive layer 216 for subsequent interconnection. Any suitable type of substrate or leadframe is used for substrate 212 in other embodiments. Typically, packages are formed on substrate 212 as a panel or strip large enough to form several to hundreds or thousands of packages at one time.

Any components desired for electrical functionality are mounted on or disposed over substrate 212 and electrically connected to conductive layers 216 using solder, solder paste, bond wires, or another suitable interconnect structure. Semiconductor die 104 is mounted to substrate 212 by disposing the semiconductor die on the substrate using, e.g., a pick-and-place process or machine, and then reflowing bumps 114 to physically and electrically connect the bumps to exposed contact pads of conductive layer 216. An optional underfill 218 is disposed between semiconductor die 104 and substrate 212. Underfill 218 can be disposed on semiconductor die 104, substrate 212, or both prior to mounting the semiconductor die. Alternatively, mold underfill 218 can be dispensed under semiconductor die 104 using capillary action after mounting the die to substrate 212.

Figure 3D:
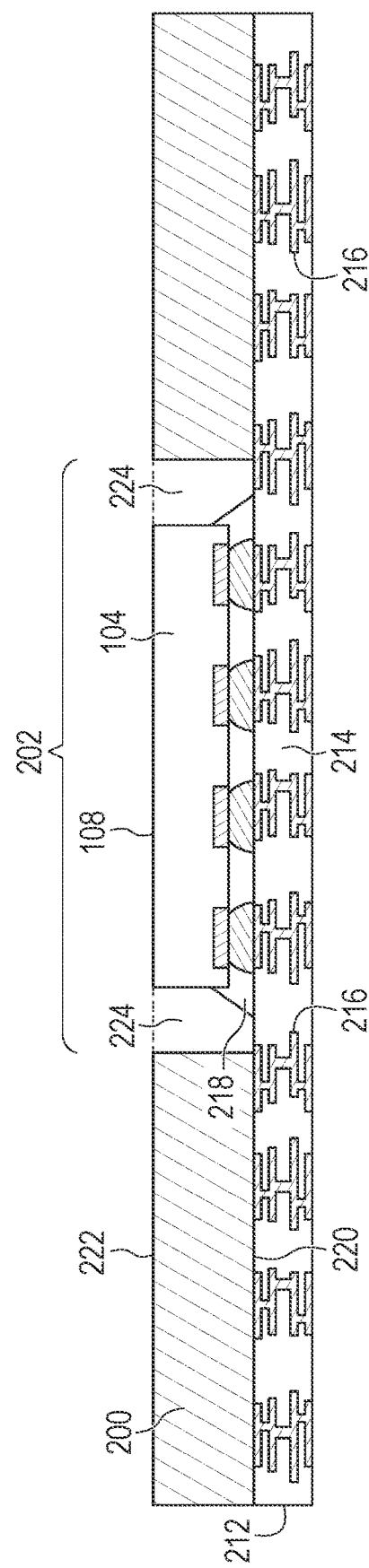

Heat spreader 200 is shown installed around semiconductor die 104 in FIG. 3d. Bottom surface 220 of heat spreader 200 is disposed in physical contact with the top surface of substrate 212. An adhesive layer is typically disposed between heat spreader 200 and substrate 212 to adhere the heat spreader to the substrate. A thickness of heat spreader 200 should be selected so that top surface 222 of the heat spreader is approximately the same height over substrate 212 as back surface 108 of semiconductor die 104. Back surface 108 and top surface 222 should be approximately coplanar. The heights of semiconductor die 104 and heat spreader 200 can be different, but performance and reliability will be improved by having their top surfaces coplanar.

Opening 202 is sized to be slightly larger than semiconductor die 104 in plan view. Semiconductor die 104 fits completely within opening 202. Heat spreader 200 extends completely around semiconductor die 104 once installed. A gap 224 between die 104 and heat spreader 200 should be just large enough so that the heat spreader can lay flat on substrate 200 without interference from underfill 218. There is no minimum or maximum size for gap 224, but a smaller gap will likely improve performance. The overall length and width of heat spreader 200 can be any suitable values. A larger heat spreader 200 will allow greater sinking of thermal energy from semiconductor 104.

Gap 224 is filled with a thermally conductive material to provide one avenue of thermal energy release from semiconductor die 104 to heat spreader 200. FIGS. 3e-3g show three different options for filling gap 224.

In FIG. 3e, a thermally conductive adhesive 230 is dispensed into gap 224. Adhesive 230 can be a curable epoxy or silicone-based adhesive, e.g., polydimethylsiloxane. The volume of adhesive 230 is controlled to fill gap 224 such that a top surface 232 of the adhesive is coplanar with heat spreader 200 and semiconductor die 104. In another embodiment, gap 224 is overfilled with adhesive 230 and then backgrinded down to be coplanar. Semiconductor die 104 and heat spreader 200 can also be backgrinded with adhesive 230 to ensure all three surfaces 108, 222, and 232 are coplanar.

In FIG. 3f, a preformed elastomer plug 240 is disposed into gap 224 as an alternative to adhesive 230. Plug 240 is shaped the same as or similarly to gap 224, e.g., a hollow square with an inner perimeter that is approximately the same size as die 104 and an outer perimeter that is approximately the same size is opening 202. Plug 240 is slightly larger than gap 224 in one embodiment, so that the plug is slightly compressed and sides of the plug press against the sides of semiconductor die 104 and heat spreader 200. Plug 240 can have one or more sloped surfaces so that the bottom of the plug is easier to get into the gap while the top applies more pressure against die 104 and heat spreader 200. Being thinner at the bottom can also help plug 240 to accommodate the protrusion of underfill 218 into gap 224. Plug 240 is pressed into gap 224 using a plate 242 until the plate contacts heat spreader 200 and die 104 to make the top surface of the plug substantially coplanar with the top surfaces of the semiconductor die and heat spreader. In one embodiment, an adhesive similar to adhesive 230 is disposed into gap 224 prior to installing plug 240 to improve retention of the plug in the gap.

In FIG. 3g, adhesive 250 is dispensed around semiconductor die 104 prior to disposing heat spreader 200 onto substrate 212. Adhesive 250 can be any suitable thermally conductive adhesive, such as those discussed above for adhesive 230. Adhesive 250 is dispensed onto substrate 212 around semiconductor die 104, covering the exposed portion of underfill 218, and also contacting side surfaces of the semiconductor die.

Heat spreader 200 is disposed down around semiconductor die 104, which displaces some adhesive 250 and transforms the adhesive into the shape of gap 224. The volume of adhesive 250 dispensed is controlled to substantially fill gap 224 with consideration for some of the adhesive being pressed between the bottom surface of heat spreader 200 and the top surface of substrate 212. Additional adhesive can be dispensed to completely fill gap 224 after installing heat spreader 200 if needed.

FIG. 3h shows gap 224 completely filled. Although any of the methods from FIGS. 3e-3g can be used, adhesive 230 is shown for example. With any of the above methods, the result is gap 224 filled with a thermally conductive material and a substantially planar top surface 260 of the package comprising surfaces of semiconductor die 104, heat spreader 200, and the thermally conductive material disposed in gap 224. Adhesive 230 or 250 is cured as needed. Plug 240 may be cured if only partially cured prior to insertion into gap 224 or if an additional adhesive used to hold in the plug needs to be cured.

Figure 3I:
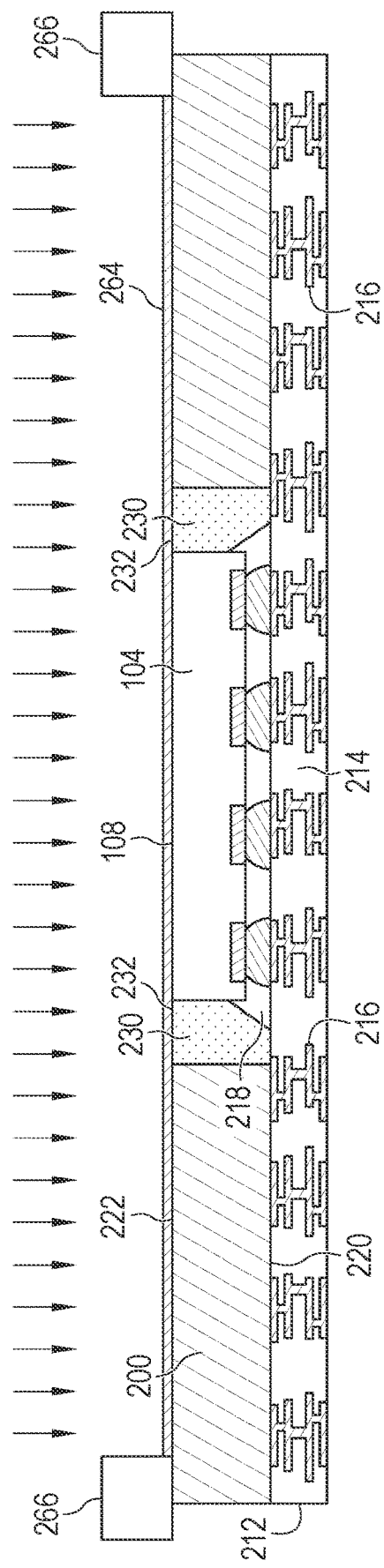

In FIG. 3i, a conductive material is sputtered over surface 260 to form a conductive layer 264. Conductive layer 264 is formed using any suitable metal deposition technique, e.g., chemical vapor deposition, physical vapor deposition, other sputtering methods, spraying, or plating. The sputtered material can be copper, steel, aluminum, gold, combinations thereof, or any other suitable conductive material. In some embodiments, conductive layer 264 can be made by sputtering on multiple layers of differing material, e.g., stainless steel-copper-stainless steel or titanium-copper.

An optional mask 266 is used to block conductive material 264 from being sputtered onto substrate 212 around heat spreader 200. In another embodiment, heat spreader 200 is formed and processed as a sheet with multiple heat spreader units attached to each other. No mask 266 is needed because there is no gap in heat spreader 200 between units. Heat spreader 200 is singulated along with substrate 212 after the package is completed and ends up with the same footprint as the resulting semiconductor package.

Figure 3J:
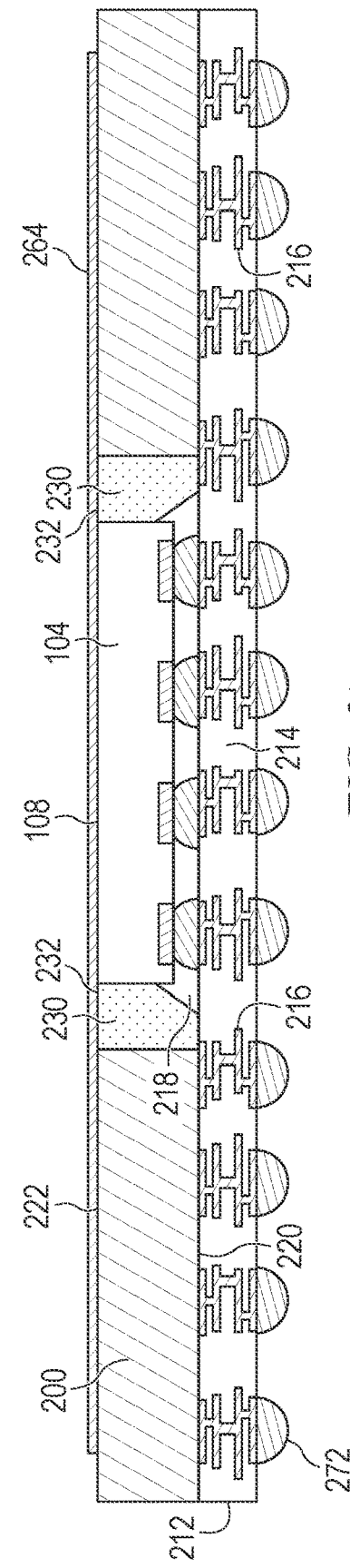

FIG. 3j shows a completed package 270 with bumps 272 formed on the bottom of substrate 212 in a similar manner to how bumps 114 were formed on semiconductor die 104. Semiconductor die 104 is electrically coupled to bumps 272 through substrate 212. Conductive layer 264 physically contacts both semiconductor die 104 and heat spreader 200. Conductive layer 264 increases thermal transfer from semiconductor die 104 to heat spreader 200 and presents a uniform flat upper surface to the resulting package similar to heat spreader 132 in the prior art while being less thick. The overall package thickness is reduced compared to the prior art by having conductive layer 264 formed directly on back surface 108 of semiconductor die 104 rather than having a TIM layer and a thicker heat spreader both over the semiconductor die. Having conductive layer 264 sputtered directly on semiconductor die 104 also helps thermal conductivity by eliminating TIM in the thermal path to the heat spreader.

Figure 4:
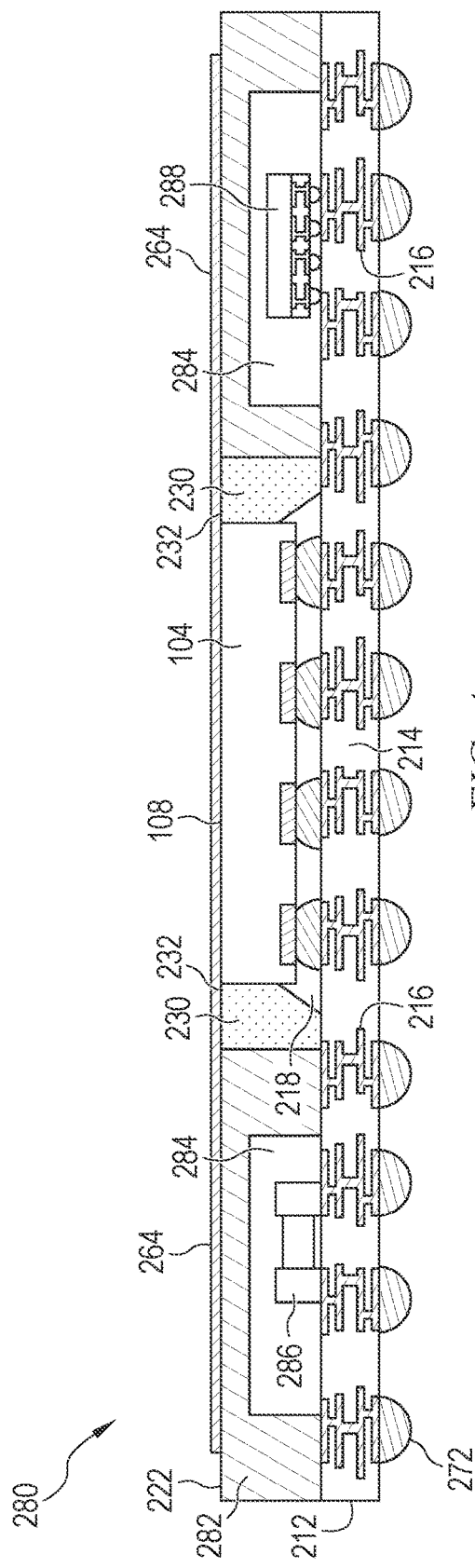
FIG. 4 illustrates an open heat spreader design with cavities to accommodate underlying components.

FIG. 4 illustrates a semiconductor package 280 using an alternative design for heat spreader 282. Heat spreader 282 includes one or more cavities 284 to allow components on substrate 212 to protrude into the heat spreader. Passive device 286 and subpackage 288 are disposed in two separate cavities 284 in heat spreader 282. Any desired electrical component can be mounted onto substrate 212 and have a corresponding cavity 284 formed in heat spreader 282. Any number of cavities 284 can be formed, and any number of components can be disposed within each individual cavity. Package 280 is otherwise formed in substantially the same manner as described above for package 270.

Figure 5:
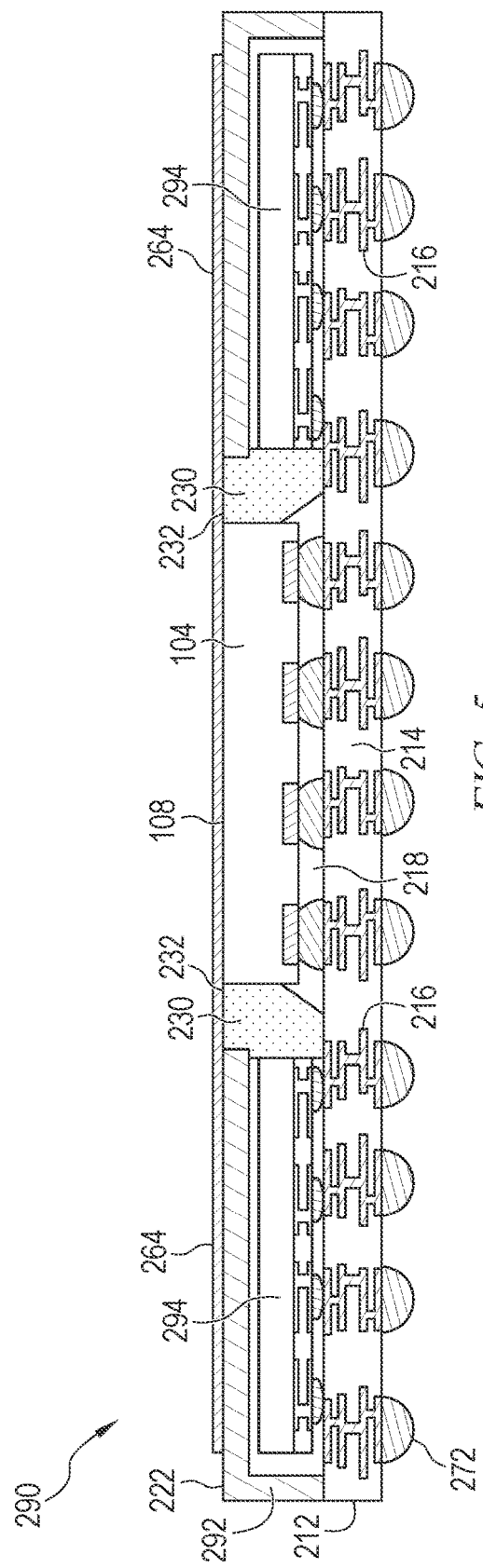
FIG. 5 illustrates a multi-package module formed with an open heat spreader design.

FIG. 5 illustrates semiconductor package 290 with a heat spreader 292. Package 290 is a multi-chip module (MCM) or multi-package module (MPM). In addition to semiconductor die 104 being disposed in opening 202, one or more other subpackages or bare die 294 are disposed under heat spreader 292. Heat spreader 292 is made with one large cavity under the heat spreader, similar to a traditional lid but with the addition of opening 202 formed for semiconductor die 104. Any number and type of electrical components can be disposed under heat spreader 292.

The area underneath heat spreader 292 can be just large enough for the components within the area, or the entire heat spreader can be formed as one large cavity. Gap 224 is formed between subpackages 294 and semiconductor die 104. Adhesive 230, or one of the other thermally conductive filler options, helps transfer thermal energy from subpackages 294 to heat spreader 292. The thermally conductive adhesive or a thermal interface material (TIM) can be disposed between other surfaces of subpackages 294 and lid 292.

Heat spreader 292, with the lid form factor, can be used without other semiconductor packages or die disposed under the heat spreader. Adhesive 230 is dispensed against the side surface of die 104 in sufficient quantity to extend to heat spreader 292 without being held in place by subpackages 294. Alternatively, plug 240 or pre-dispensed adhesive 250 can be used.

Figure 6:
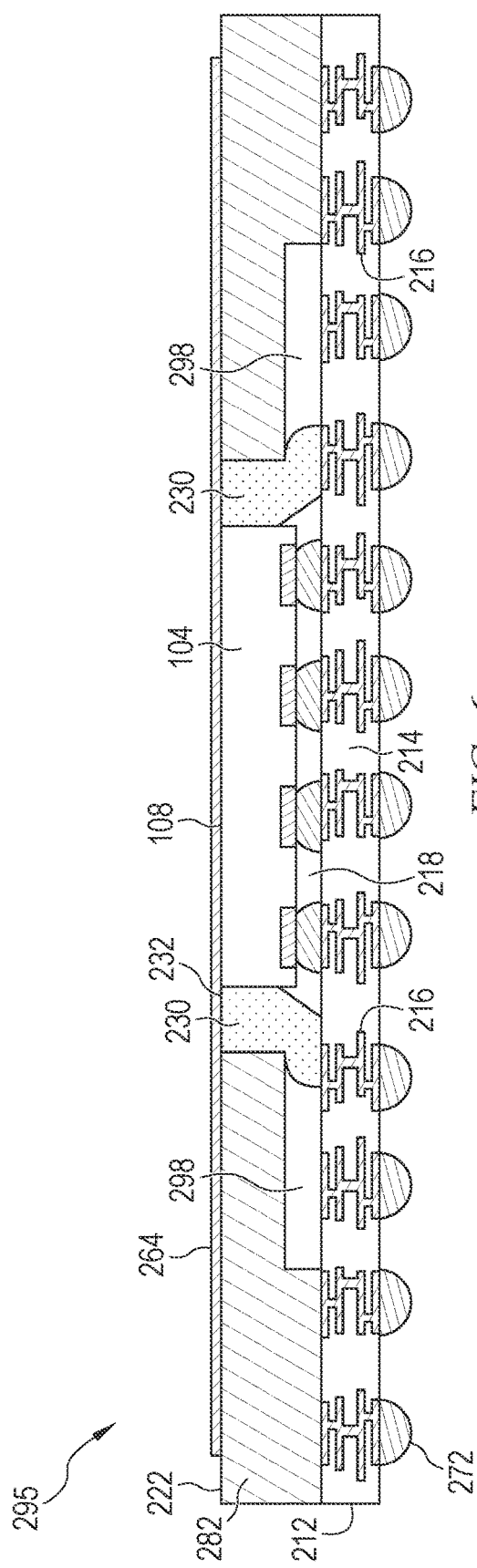
FIG. 6 illustrates a half-etched open heat spreader design.

FIG. 6 shows package 295 with heat spreader 296. Heat spreader 296 is etched to approximately half height around opening 202. The half-etching creates a gap 298 between substrate 212 and heat spreader 296 around die 104. Gap 298 allows more of the adhesive 250 applied prior to heat spreader 296 being disposed on substrate 212 to stay under the heat spreader and reduces the amount that is squeezed out over the top of the heat spreader.

Figure 7:
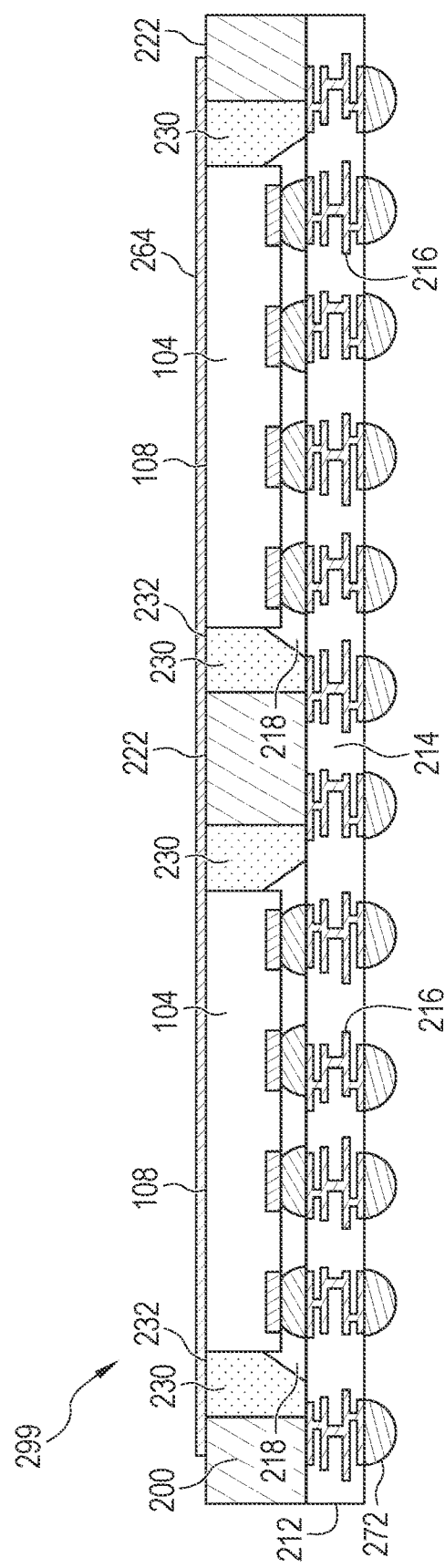
FIG. 7 illustrates a multi-die package.

FIG. 7 illustrates an embodiment with two die 104 with a single heat spreader 200. Two openings 202 are formed, one for each die 104. Gaps 224 of both openings 202 are filled with adhesive 230 or another thermally conductive material as above. The gaps 224 can be filled together or one at a time. In another embodiment, an opening 202 is formed large enough to accommodate both die 104. In that case, gap 224 extends between the two die 104, but heat spreader 200 does not extend between the die. Any number of die can be disposed within a single heat spreader 200. Conductive layer 264 is sputtered onto back surfaces 108 of both die 104 and extends continuously from back surface 222 of heat spreader 200 to both die.

Figure 8A:
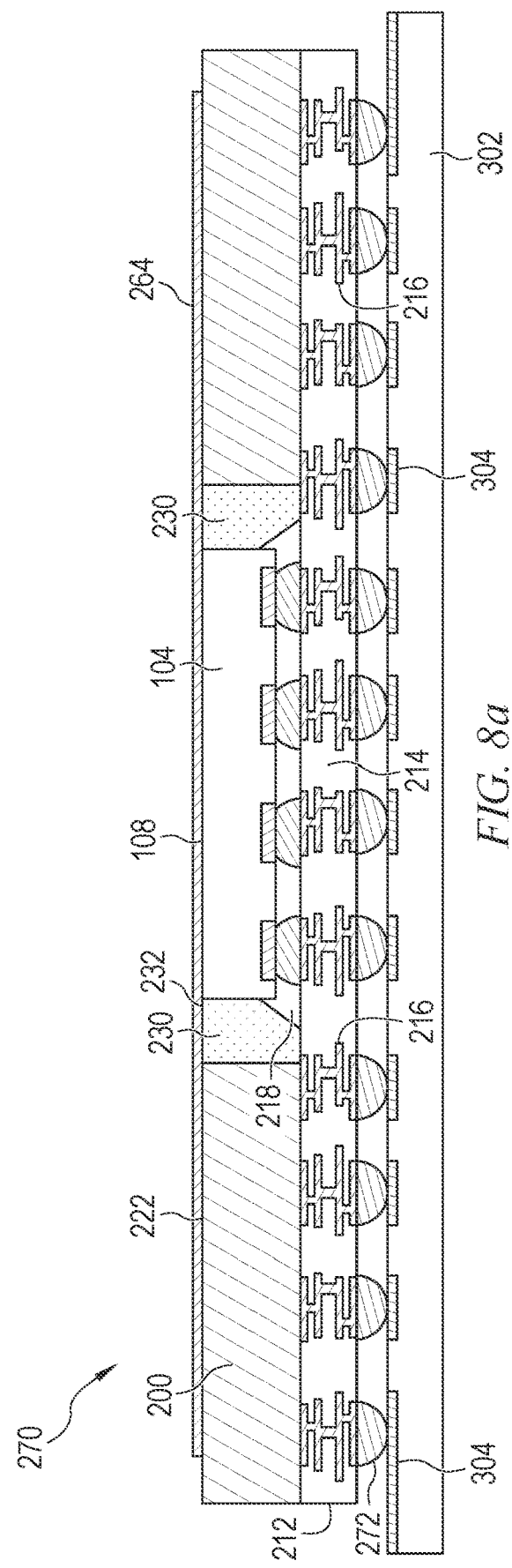
FIGS. 8a and 8b illustrate integrating the heat spreader packages into an electronic device.
Figure 8B:
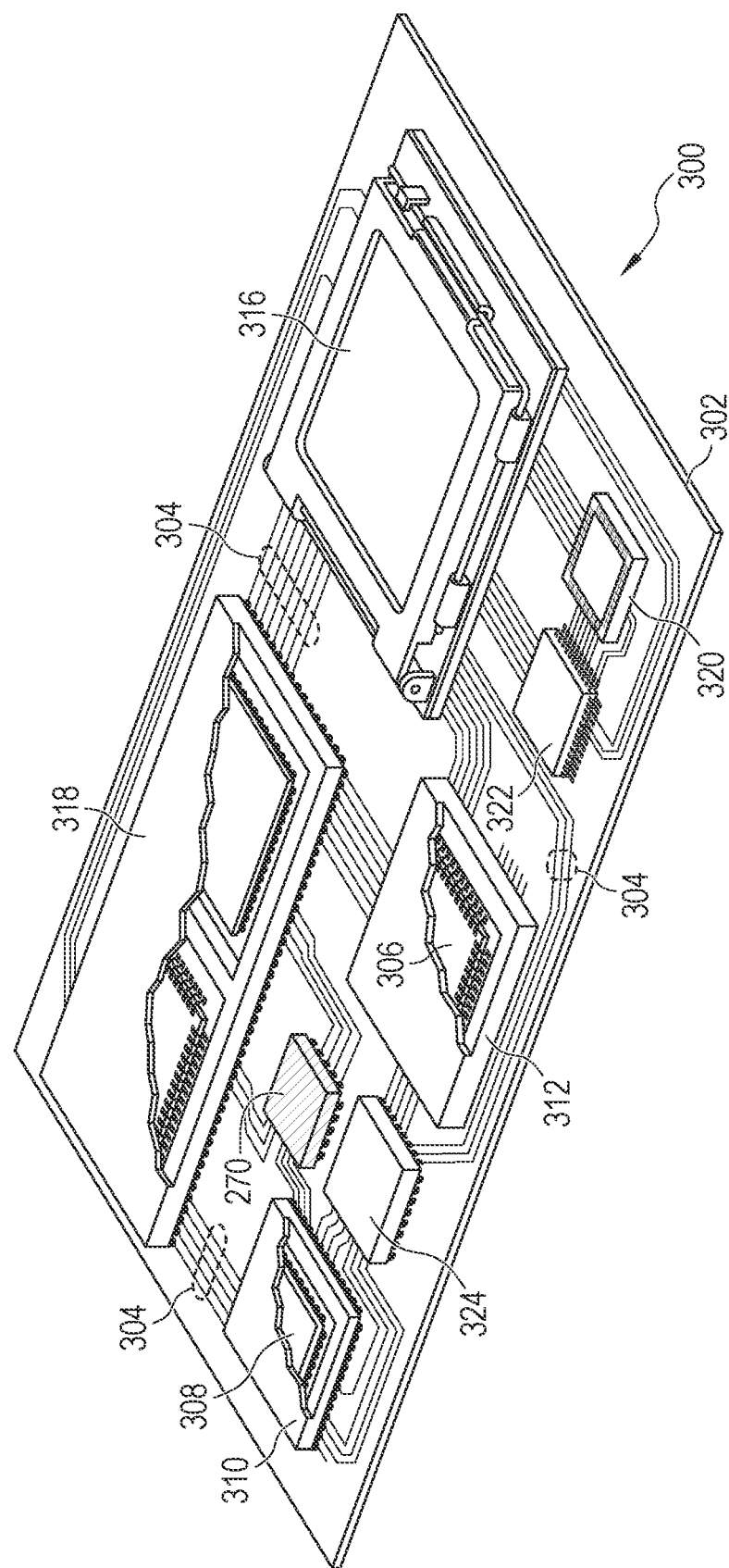

FIGS. 8a and 8b illustrate incorporating the above-described packages, e.g., package 270 with heat spreader 200, into an electronic device 300. FIG. 8a illustrates a partial cross-section of package 270 mounted onto a printed circuit board (PCB) or other substrate 302 as part of electronic device 300. Bumps 272 are reflowed onto conductive layer 304 of PCB 302 to physically attach and electrically connect package 270 to the PCB. In other embodiments, thermocompression or other suitable attachment and connection methods are used. In some embodiments, an adhesive or underfill layer is used between package 270 and PCB 302. Semiconductor die 104 is electrically coupled to conductive layer 304 through substrate 212 and bumps 272.

FIG. 8b illustrates electronic device 300 with a plurality of semiconductor packages mounted on a surface of PCB 302, including package 270. Electronic device 300 can have one type of semiconductor package, or multiple types of semiconductor packages, depending on the application. Electronic device 300 can be a stand-alone system that uses the semiconductor packages to perform one or more electrical functions. Alternatively, electronic device 300 can be a subcomponent of a larger system. For example, electronic device 300 can be part of a tablet computer, cellular phone, digital camera, communication system, or other electronic device. Electronic device 300 can also be a graphics card, network interface card, or another signal processing card that is inserted into a computer. The semiconductor packages can include microprocessors, memories, ASICs, logic circuits, analog circuits, RF circuits, discrete active or passive devices, and other semiconductor die or electrical components.

In FIG. 8b, PCB 302 provides a general substrate for structural support and electrical interconnection of the semiconductor packages mounted on the PCB. Conductive signal traces 304 are formed over a surface or within layers of PCB 302 using evaporation, electrolytic plating, electroless plating, screen printing, or other suitable metal deposition process. Signal traces 304 provide for electrical communication between the semiconductor packages, mounted components, and other external systems or components. Traces 304 also provide power and ground connections to the semiconductor packages as needed.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to PCB 302. In other embodiments, a semiconductor device may only have the first level packaging where the die is mechanically and electrically mounted directly to PCB 302.

For the purpose of illustration, several types of first level packaging, including bond wire package 306 and flipchip 308, are shown on PCB 302. Additionally, several types of second level packaging, including ball grid array (BGA) 310, bump chip carrier (BCC) 312, land grid array (LGA) 316, multi-chip module (MCM) 318, quad flat non-leaded package (QFN) 320, quad flat package 322, and eWLB 324 are shown mounted on PCB 302 along with package 270. Conductive traces 304 electrically couple the various packages and components disposed on PCB 302 to package 270, giving use of the components within package 270 to other components on the PCB.

Depending upon the system requirements, any combination of semiconductor packages, configured with any combination of first and second level packaging styles, as well as other electronic components, can be connected to PCB 302. In some embodiments, electronic device 300 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

While one or more embodiments of the present invention have been illustrated in detail, the skilled artisan will appreciate that modifications and adaptations to those embodiments may be made without departing from the scope of the present invention as set forth in the following claims.

What is claimed is:

1. A method of making a semiconductor device, comprising:
   providing a substrate;
   providing a heat spreader including an opening formed through the heat spreader;
   disposing a semiconductor die over the substrate;
   disposing the heat spreader over the substrate with the semiconductor die in the opening; and
   disposing a thermally conductive material in the opening between the heat spreader and semiconductor die, wherein the thermally conductive material is a pre-formed elastomer plug.

2. The method of claim 1, further including forming a conductive layer over the substrate, heat spreader, and thermally conductive material.

3. The method of claim 1, further including disposing the thermally conductive material with a surface of the thermally conductive material that is substantially coplanar to a surface of the semiconductor die and a surface of the heat spreader.

4. The method of claim 1, further including:
disposing a semiconductor package over the substrate; and
disposing the heat spreader over the semiconductor package.

5. A method of making a semiconductor device, comprising:
providing a heat spreader including an opening formed through the heat spreader;
disposing a semiconductor die in the opening;
disposing a preformed elastomer plug around the semiconductor die between the semiconductor die and heat spreader; and
forming a conductive layer over the heat spreader, preformed elastomer plug, and semiconductor die, wherein the conductive layer completely covers the semiconductor die.

6. The method of claim 5, wherein the preformed elastomer plug includes a thermally conductive material.

7. The method of claim 5, wherein the conductive layer is sputtered to extend from a surface of the heat spreader to a surface of the semiconductor die.

8. The method of claim 5, further including disposing the heat spreader over a semiconductor package.

9. The method of claim 5, further including disposing a thermally conductive adhesive in contact with a side surface of the semiconductor die prior to disposing the semiconductor die in the opening of the heat spreader.

10. A semiconductor device, comprising:
a substrate;
a heat spreader including an opening disposed over the substrate;
a semiconductor die disposed over the substrate in the opening; and
a thermally conductive material disposed in the opening between the heat spreader and semiconductor die, wherein the thermally conductive material is a preformed elastomer plug.

11. The semiconductor device of claim 10, further including a conductive layer formed over the substrate, heat spreader, and thermally conductive material.

12. The semiconductor device of claim 10, wherein a surface of the thermally conductive material is substantially coplanar to a surface of the semiconductor die and a surface of the heat spreader.

13. The semiconductor device of claim 10, further including a semiconductor package disposed between the heat spreader and substrate.

14. A semiconductor device, comprising:
a heat spreader including an opening;
a semiconductor die disposed in the opening;
a preformed elastomer plug disposed around the semiconductor die between the semiconductor die and heat spreader; and
a conductive layer formed over the heat spreader, preformed elastomer plug, and semiconductor die, wherein the conductive layer completely covers the semiconductor die.

15. The semiconductor device of claim 14, wherein the preformed elastomer plug includes a thermally conductive material.

16. The semiconductor device of claim 14, further including an electrical component disposed in a cavity of the heat spreader.

17. The semiconductor device of claim 16, wherein the electrical component is a semiconductor package.

* * * * *